US007878296B2

(12) United States Patent
Lee

(10) Patent No.: US 7,878,296 B2
(45) Date of Patent: Feb. 1, 2011

(54) SPEAKER EMBODYING A STEREO SOUND

(76) Inventor: In-hee Lee, 677-7 Naebalsan-Dong, Gangseo-gu, Seoul (KR) 157-828

( * ) Notice: Subject to any disclaimer, the term of this patent is extended or adjusted under 35 U.S.C. 154(b) by 0 days.

(21) Appl. No.: 11/814,261

(22) PCT Filed: Jan. 20, 2006

(86) PCT No.: PCT/KR2006/000222

§ 371 (c)(1), (2), (4) Date: Jul. 18, 2007

(87) PCT Pub. No.: WO2006/078133

PCT Pub. Date: Jul. 27, 2006

(65) Prior Publication Data

US 2008/0190688 A1 Aug. 14, 2008

(51) Int. Cl.
*H05K 5/00* (2006.01)

(52) U.S. Cl. ....................... 181/148; 181/152; 181/155; 181/153

(58) Field of Classification Search ................. 181/148, 181/155, 153, 156, 152
See application file for complete search history.

(56) References Cited

U.S. PATENT DOCUMENTS

| | | | | | |
|---|---|---|---|---|---|
| 2,123,442 | A | * | 7/1938 | Stone | 181/148 |
| 2,971,598 | A | * | 2/1961 | Sieler | 181/152 |
| 3,023,830 | A | * | 3/1962 | Hammes | 181/141 |
| 4,082,159 | A | * | 4/1978 | Petty | 181/156 |
| 4,210,223 | A | * | 7/1980 | Gillum et al. | 181/152 |
| 4,314,620 | A | * | 2/1982 | Gollehon | 181/144 |
| 4,592,444 | A | * | 6/1986 | Perrigo | 181/151 |
| 4,618,025 | A | * | 10/1986 | Sherman | 181/148 |
| 4,853,964 | A | * | 8/1989 | Weckler | 381/341 |
| 4,893,695 | A | * | 1/1990 | Tamura et al. | 181/151 |
| 4,924,962 | A | * | 5/1990 | Terai et al. | 181/141 |
| 4,928,788 | A | * | 5/1990 | Erickson | 181/141 |
| 5,189,706 | A | * | 2/1993 | Saeki | 381/349 |
| 5,197,103 | A | * | 3/1993 | Hayakawa | 381/349 |
| 5,313,525 | A | * | 5/1994 | Klasco | 381/350 |
| 5,359,158 | A | * | 10/1994 | Queen | 181/150 |
| 5,637,840 | A | * | 6/1997 | Kim | 181/152 |
| 5,804,774 | A | * | 9/1998 | Ford et al. | 181/152 |
| 5,821,471 | A | * | 10/1998 | McCuller | 181/156 |
| 5,825,900 | A | * | 10/1998 | Jeon | 381/339 |
| 5,898,788 | A | * | 4/1999 | Kim | 381/341 |
| 5,996,727 | A | * | 12/1999 | Blind et al. | 181/141 |
| 6,012,542 | A | * | 1/2000 | Accordino | 181/199 |

(Continued)

FOREIGN PATENT DOCUMENTS

| | | | | |
|---|---|---|---|---|
| JP | 62-51900 | A | * | 3/1987 |

*Primary Examiner*—Jeffrey Donels
*Assistant Examiner*—Forrest M Phillips
(74) *Attorney, Agent, or Firm*—John K. Park; Park Law Firm

(57) ABSTRACT

The present invention relates to speakers and, more particularly, to a speaker sound system, characterized in that the speaker, mounted on a speaker housing constituting a sound emission apparatus, has a guide cover to guide sound radiating from the back of the speaker forwards when the sound is output both forwards and backwards because of fluctuations of a cone of the speaker due to electrical signals, that is integrally attached to the surface of the speaker, thereby providing vivid high-fidelity sound.

2 Claims, 2 Drawing Sheets

U.S. PATENT DOCUMENTS

| | | | | |
|---|---|---|---|---|
| 6,062,339 | A * | 5/2000 | Hathaway | 181/156 |
| 6,144,751 | A * | 11/2000 | Velandia | 381/345 |
| 6,349,792 | B1 * | 2/2002 | Smith et al. | 181/156 |
| 6,356,643 | B2 * | 3/2002 | Yamagishi et al. | 381/349 |
| 6,568,502 | B2 * | 5/2003 | Chang | 181/153 |
| 6,862,360 | B2 * | 3/2005 | Tsai | 381/351 |
| 7,201,252 | B2 * | 4/2007 | Nevill | 181/151 |
| 7,436,972 | B2 * | 10/2008 | Bouvier | 381/345 |
| 2003/0091212 | A1 * | 5/2003 | Nakada | 381/433 |
| 2004/0084242 | A1 * | 5/2004 | Masuda | 181/148 |
| 2004/0159490 | A1 * | 8/2004 | Marlin | 181/148 |
| 2005/0092543 | A1 * | 5/2005 | Lin | 181/148 |
| 2006/0185930 | A1 * | 8/2006 | Shu | 181/148 |
| 2008/0190688 | A1 * | 8/2008 | Lee | 181/148 |

* cited by examiner

[Fig. 1]
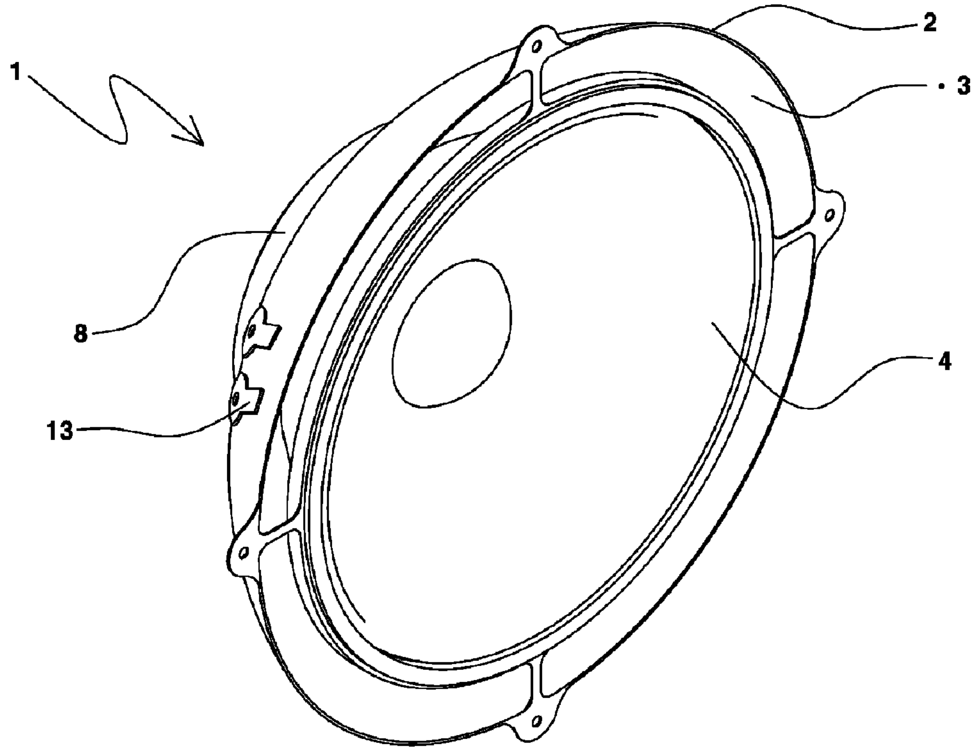
[Fig. 2]
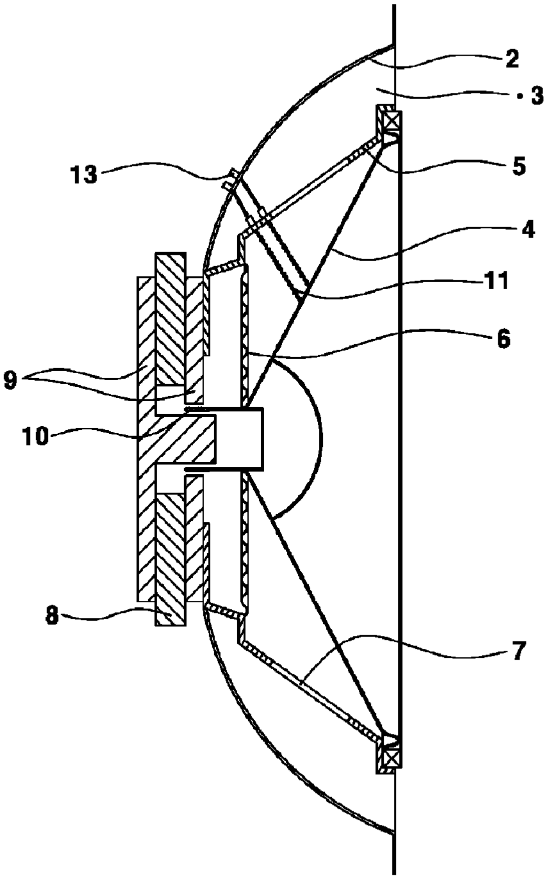

[Fig. 3]
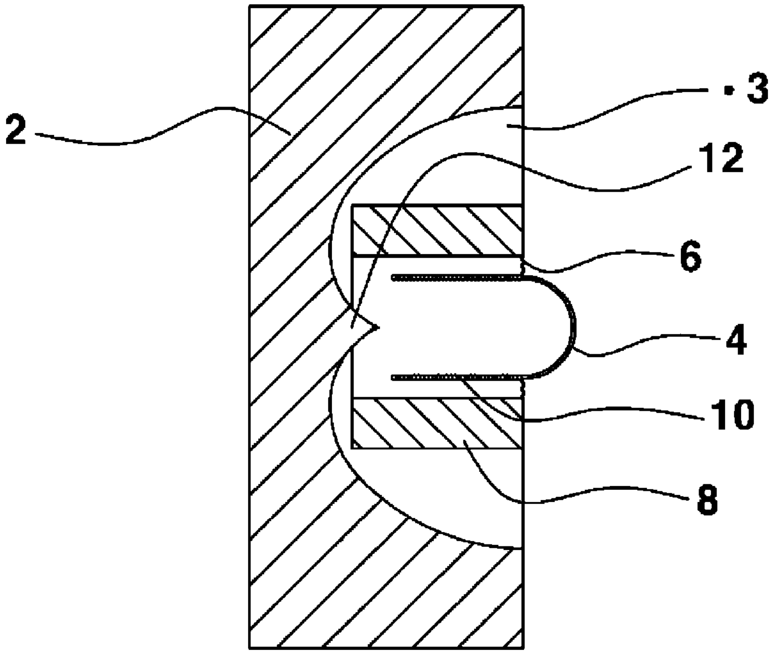

SPEAKER EMBODYING A STEREO SOUND

TECHNICAL FIELD

The present invention relates to speakers and, more particularly, to a speaker sound system, characterized in that the speaker, mounted on a speaker housing constituting a sound emission apparatus, has a guide cover to guide sound radiating from the back of the speaker forwards when the sound is output both forwards and backwards because of fluctuations of a cone of the speaker due to electrical signals, that is integrally attached to the surface of the speaker, thereby realizing vivid high-fidelity sound.

BACKGROUND ART

Generally, speakers are employed in a variety of electronic products, in order to output audible signals to the outside as required.

According to the intended use, there are large-sized speakers, small-sized speakers internally installed in compact electronic goods such as cellular phones, or personal portable terminals, and other goods.

A speaker is constructed with an injection-molded frame, a yoke installed in the middle of the frame, a magnet, a vibration coil, a vibration plate, a cone, and other parts. To an outer circumferential end of the speaker is connected the vibration coil, and a connection part that connects to an external connection terminal is provided.

Accordingly, signals input into the speaker include all of the information associated with the sound, such as amplitude, frequency of vibrations, and other characteristics, because the electrical signals, which are input into an electromagnet, contain therein the sound information.

The electromagnet, into which the sound information is input, generates different polarizations (N-pole or S-pole) and different strengths of the magnet according to the electrical signals, and accordingly, a permanent magnet, whose strength is constant, is placed behind the magnet.

According to the directions of the N-poles of the two magnets, the two magnets may repulse or attract each other due to the characteristics of the electromagnet. Furthermore, the attractive or repulsive force may increase or decrease according to the magnet strength.

To an end of the electromagnet is attached a round-shaped cone in the middle of the speaker. As this cone moves synchronously with the movement of the electromagnet, a peak which functions as a vibration plate and is attached to the cone, is moved accordingly, thereby vibrating ambient air and producing sound.

When the sound is output as the electrical signals activate the speaker in the sound emission apparatus, the positive zone of the signals vibrates the air as the vibration plate of the speaker moves forward and the negative zone of the signals vibrates the air as the vibration plate of the speaker moves backward, thereby producing sound.

When a speaker is installed in a conventional structure, sound transmitted forwards and sound transmitted rearwards based on the boundary between the front and the back of the cone are not synchronized but are separated. Accordingly, a listener first hears the forwardly transmitted sound and then the rearwardly transmitted sound and thus does not hear the intended sound because of the time difference between the forwardly transmitted sound and the rearwardly transmitted sound.

In order to allow the hearer to hear the rearwardly transmitted sound simultaneously with the forwardly transmitted sound, normally two speakers are oppositely connected such that a hearer can hear the forwardly transmitted sound and the rearwardly transmitted sound simultaneously in front of the speaker.

The sound output to the back from the two sources is not necessary, but merely functions to interfere with the sound output to the front from the two sources. Because of this interfering sound, the listener cannot clearly hear even the sound emitted to the front from the two sources. The interfering sound is mixed with the rearwardly transmitted sound. Thus, since the hearer hears the intended forwardly projected sound and the rearwardly projected interference simultaneously, he/she does not experience high-fidelity sound.

When headphones are used, the user hears positive (+) forwardly transmitted sound through one ear but negative (−) rearwardly transmitted sound through the other ear, and he/she may perceive this as intended sound. At this time, the sound transmitted rearwards may be heard by a person next to him/her.

To eliminate the possibility of the rearwardly transmitted sound functioning as interference, several devices may be added to the speaker housing; but these fails because the sound flowing therefrom ultimately functions as interference.

DISCLOSURE OF INVENTION

Technical Problem

Accordingly, the present invention has been made keeping in mind the above problems occurring in the prior art, and an object of the present invention is to provide a speaker realizing vivid high-fidelity sound to a hearer, wherein a guide cover is integrally attached to the surface of the speaker, in order to guide the rearwardly transmitted sound to the front of the speaker, so that the forwardly transmitted sound and the rearwardly transmitted sound separately output based on the boundary between the front and the back of a cone in the speaker are synchronized together.

Technical Solution

In order to achieve the above object, according to one aspect of the present invention, there is provided a speaker realizing vivid high-fidelity sound, in which a vibration plate, a damper and a lead wire are sequentially placed in the front thereof, having a frame enclosing the vibration plate with an interval defined between the frame and the vibration plate, in the center of which a through hole is formed in which a vibration coil, a yoke, and a magnet are provided, and a connection part connected to the vibration coil and to an external terminal, formed in an outer circumferential end of the frame, the speaker comprising: a guide cover having an opening part and attached to a center of an outer circumference of the frame enclosing the vibration plate, with an interval defined between the frame and the guide cover, guiding and reflecting rearwardly transmitted sound generated behind the vibration plate since it overlaps the front, thereby being capable of outputting the rearwardly transmitted sound simultaneously with forwardly transmitted sound.

Advantageous Effects

As is apparent from the above descriptions, the speaker of the present invention may effectively realize high-fidelity sound since rearwardly transmitted sound is output simultaneously with forwardly transmitted sound, due to integral attachment or a guide cover so as to guide the rearwardly transmitted sound to the front, which is overlapped with a frame positioned in the back of a vibration plate, with a gap defined between them.

In addition, the present invention does not require a speaker housing because the guide cover, attached to the speaker, provides vivid sound, thereby reproducing high-fidelity sound, so that the present invention does not need two speakers in order to output forwardly transmitted sound and rearwardly transmitted sound simultaneously. Since a speaker housing is not needed, it is possible to produce a compact and slim speaker in an easy manner. Further, the rearwardly transmitted sound does not interfere with the vibration of a cone.

The present invention further provides an effect of increasing durability of sound producing apparatuses because their insides do not vibrate.

BRIEF DESCRIPTION OF THE DRAWINGS

FIG. 1 is a perspective view illustrating a speaker according to an embodiment of the present invention;

FIG. 2 is a sectional view illustrating the speaker according to the embodiment of the present invention; and FIG. 3 is a sectional view illustrating a speaker according to another embodiment of the present invention.

DESCRIPTION OF REFERENCE NUMBERS TO MAIN ELEMENTS

1: Speaker 2: Guide cover
3: Opening Part 4: Vibration Plate
5: Frame 6: Damper
7: Through Hole 8: Magnet
9: Yoke 10: Vibration Coil
11: Lead Wire 12: Guide projection
13: Connection Terminal

BEST MODE FOR CARRYING OUT THE INVENTION

Hereinafter, preferred embodiments of the present invention will be described with reference to the accompanying drawings.

FIG. 1 is a perspective view illustrating a speaker according to an embodiment of the present invention, and FIG. 2 is a sectional view illustrating the speaker according to the embodiment of the present invention.

The speaker mounted on a housing according to the present invention includes a guide cover integrally attached thereto, the guide cover encompassing the outer circumference of the frame 5 of the speaker 1, in order to solve the problem of high-fidelity sound being degraded because the forwardly transmitted sound and the rearwardly transmitted sound are separately transmitted in different directions based on the boundary between the front and the back of a vibration plate 4 and are not synchronized, whereby they are heard at different times by a listener.

The guide cover 2 may have a variety shapes so as to completely cover the outer circumference, depending upon the shape of the frame 5 placed behind the vibration plate 4 of the speaker 1. However, since the speaker 1 is generally manufactured to have a round shape, the guide cover 2 is preferably shaped as a hemispherical cover, the front of which is open, with a through hole formed in the center of the guide cover 2 and a magnet inserted in the through hole.

Accordingly, the vibration plate 4, which produces sound vibration, a damper, which holds the vibration plate 4, a lead wire 11, which connects electrical signals to a vibration coil 10, and the vibration coil 10, which functions as an electromagnet, are sequentially placed. The vibration coil 10 is placed in the center of the vibration plate 4, so that the frame 5, having a through hole in the center thereof, can enclose the outer circumferences of the vibration plate 4, the damper 6, the lead wire 11 and the vibration coil 10.

The frame 5 has a plurality of through holes 7 so that air can circulate to the back of the vibration plate 4.

A yoke 9, which holds the other side of the vibration coil 10 and the magnet 8, is formed in the through hole in the center of the frame 6 encompassing the vibration plate 4, being spaced apart at an interval from the vibration plate 4, and a connection part 13 to connect to the vibration coil 10 and to an external connection terminal is provided in an outer circumferential side end of the frame 5, one side of the guide cover 2 being fixed in the center of the outer circumference of the frame 5, thereby overlapping and encompassing the frame 5.

At this time, the guide cover enclosing the outer circumference of the frame 5 is spaced apart at an interval from the frame 5 and forms an opening part 3 in the front of the speaker 1 so as to guide the rearwardly transmitted sound output behind the vibration plate 4.

Accordingly, the rearwardly transmitted sound generated behind the vibration plate 4 can be guided and reflected to the front of the speaker 1 and can be output simultaneously with the forwardly transmitted sound, thereby providing high-fidelity sound to the listeners.

In addition, to replace the frame 5 positioned behind the vibration plate 4, the guide cover 2 can be attached directly to the vibration plate 4 in such a manner as to thereby enclose the vibration plate 4.

FIG. 3 illustrates a speaker according to another embodiment of the present invention. In a high pitch speaker, the sound output to the back of the magnet 8, among the sound output to the front and the back of the vibration plate 4 under the state of the vibration plate 4 being inserted inside the magnet 8, can be guided to the front of the speaker. For this, a guide projection 12 whose end is inserted into the inside of the magnet 8 to perform guidance in a separate manner is integrally formed with the hemispherical guide cover 2, which is in close contact with the vibration plate 4, so that the rearwardly transmitted sound generated in the back of the vibration plate 4 is guided and output simultaneously with the forwardly transmitted sound generated in the front of the vibration plate 4.

Mode for the Invention

The speaker according to the present invention is characterized by a construction such that the speaker is provided with a guide cover in such a manner that the guide cover is attached to the central outer circumference of a frame encompassing a vibration plate, being spaced apart at an interval therefrom, and encloses the front of the speaker so that the rearwardly transmitted sound generated behind the vibration plate is guided and reflected to the front of the speaker; to achieve this, the guide cover has an opening, through which the rearwardly transmitted sound is output simultaneously with the forwardly transmitted sound.

INDUSTRIAL APPLICABILITY

The present invention has a high industrial applicability since the high-fidelity sound and the original sound can be output as they are, by outputting the forwardly transmitted sound and the rearwardly transmitted sound simultaneously owing to the integral attachment of a guide cover to the back of a speaker provided in a variety of sound emitting apparatuses or electronic appliances.

The invention claimed is:

1. A speaker realizing high-fidelity sound, in which a vibration plate, a damper and a lead wire are sequentially placed in the front thereof, having a connection part connected to the vibration coil and to an external terminal, formed in an outer circumferential end of a frame, the speaker (1) comprising:

a frame (5) enclosing the vibration plate with an interval defined between the frame and the vibration plate, in the center of which a vibration coil, a yoke, and a magnet are provided;

a cover (2) having an opening part and attached to a center of an outer circumference of the frame enclosing the vibration plate, with an interval defined between the frame and the cover, guiding and reflecting rearwardly transmitted sound generated behind the vibration plate forwardly through the opening part, thereby outputting the rearwardly transmitted sound simultaneously with forwardly transmitted sound generated in the front of the vibration plate, wherein the cover encloses the back of the vibration plate, wherein the vibration coil, the yoke, and the magnet are disposed outside the cover, and wherein the cover is hemispherical; and a plurality of through holes (7) formed on the frame, such that air circulates to back of the vibration plate and the rewardly transmitted sound is guided to the cover to be reflected forwardly through the opening part (3) of the cover.

2. A speaker realizing high-fidelity sound, in which a vibration plate, a damper and a lead wire are sequentially placed in the front thereof, having a connection part connected to the vibration coil and to an external terminal, formed in an outer circumferential end of a cover, the speaker (1) comprising:

a cover (2) having an opening part and enclosing a back of the vibration plate, in the center of which a vibration coil, a yoke, and a magnet are provided, with an interval defined between the cover and the vibration plate, guiding and reflecting rearwardly transmitted sound generated behind the vibration plate forwardly through the opening part, thereby outputting the rearwardly transmitted sound simultaneously with forwardly transmitted sound generated in the front of the vibration plate; and a plurality of through holes (7) formed on the cover, such that air circulates to back of the vibration plate and the rewardly transmitted sound is guided to the cover to be reflected forwardly through the opening part (3) of the cover.

* * * * *